United States Patent [19]

Kimizuka et al.

[11] Patent Number: 4,985,896
[45] Date of Patent: Jan. 15, 1991

[54] LASER DRIVING DEVICE

[75] Inventors: Junichi Kimizuka, Yokohama; Toshihiko Inuyama, Fujisawa; Takashi Soya; Yasutaka Noguchi, both of Kawasaki, all of Japan

[73] Assignee: Canon Kabushiki Kaisha, Tokyo, Japan

[21] Appl. No.: 256,122

[22] Filed: Oct. 11, 1988

Related U.S. Application Data

[63] Continuation of Ser. No. 844,331, Mar. 26, 1986, abandoned.

[30] Foreign Application Priority Data

| Mar. 29, 1985 | [JP] | Japan | 60-063882 |
| Mar. 29, 1985 | [JP] | Japan | 60-063883 |
| Mar. 29, 1985 | [JP] | Japan | 60-063884 |

[51] Int. Cl.$^5$ .......................... H01S 3/13; H01S 3/00
[52] U.S. Cl. ............................. 372/38; 372/31
[58] Field of Search ..................... 372/29, 31, 38; 250/205; 357/19, 306

[56] References Cited

U.S. PATENT DOCUMENTS

| 3,535,532 | 10/1970 | Merryman | 357/19 |
| 4,009,385 | 2/1977 | Sell | 372/38 |
| 4,074,143 | 2/1978 | Rokos | 250/205 |
| 4,081,670 | 3/1978 | Albanese | 372/38 |
| 4,268,843 | 5/1981 | Brown et al. | 357/30 G |
| 4,292,606 | 9/1981 | Trimmel | 372/29 |
| 4,347,610 | 8/1982 | Meuleman | 372/29 |
| 4,369,525 | 1/1983 | Breton et al. | 372/29 |
| 4,523,089 | 6/1985 | Maeda et al. | 250/205 |
| 4,580,044 | 4/1986 | Hongo et al. | 372/31 |
| 4,653,058 | 3/1987 | Akiba et al. | 372/29 |

FOREIGN PATENT DOCUMENTS

| 145680 | 8/1985 | Japan | 372/38 |
| 169180 | 9/1985 | Japan | 372/31 |

OTHER PUBLICATIONS

Chen "Simultaneous Feedback Control of Bias and Modulation Currents for Injection Lasers", Jan. 1980, pp. 7-8 vol. 16, No. 1 Electronic Letters.

Primary Examiner—Eugene R. Laroche
Assistant Examiner—Michael B. Shingleton
Attorney, Agent, or Firm—Fitzpatrick, Cella, Harper & Scinto

[57] ABSTRACT

There is disclosed a laser driving device capable of providing a stable laser emission regardless of the ambient temperature, by supplying a laser element with a first current and a second bias current with a controlled ratio therebetween.

14 Claims, 4 Drawing Sheets

ововre
LASER DRIVING DEVICE

This is a continuation of Ser. No. 844,331, filed Mar. 26, 1986, now abandoned.

BACKGROUND OF THE INVENTION

1. Field of the Invention

The present invention relates to a device for driving a laser.

2. Related Background Art

There is already known a printer for image recording with a semiconductor laser, which will be hereinafter simply called a laser. For stabilizing the amount of light emission from the laser, the Japanese Patent Laid-open No. 106259/1981 discloses a stabilizing device in which the amount of light emission from the laser is detected in a non-image area and regulated to a determined value, and is maintained in the image area.

Reference is now made to FIG. 4 for explaining a conventional laser emission control method.

FIG. 4 is a chart showing the light emission characteristic of a laser, in which the ordinate represents the amount of light while the abscissa represents the current. Curves a, b show currents of different switching modes, and a curve c indicates the light emission.

At the image recording the current to the laser is switched, and the current is completely reduced to zero when the light is turned off. As shown in said chart, the laser emits light at a current equal to or exceeding a threshold current $I_{th}$, and reaches a nominal amount of light $L_1$ at a current $I_a$. Thus the laser functions in a current range from $I_{th}$ to $I_a$. Consequently a same light emission c is obtained with a current a or b.

However, when the current is varied from 0 to $I_{th}$ in a switching transistor for driving the laser, there results an increased loss therein, thus requiring the use of a transistor with a large loss tolerance. Also a transistor with a high switching speed is needed for high-speed image recording. Such a transistor with a large loss tolerance and capable of high-speed switching is very expensive.

Also there is required a considerable time before the laser emission can be started, due to the start-up time of the driving transistor for increasing the current from zero to $I_{th}$.

In order to overcome to above-mentioned drawbacks there is proposed to supply to a laser with a bias current not exceeding $I_{th}$. However the threshold current $I_{th}$ varies if the ambient temperature is changed, so that a fixed bias, applied to the laser, gives rise to an excessive current supplied to the laser, thus causing excessively strong emission if the ambient temperature is lowered.

SUMMARY OF THE INVENTION

In consideration of the foregoing, an object of the present invention is to provide an improved laser driving device.

Another object of the present invention is to provide a laser driving device allowing continuous output of a stable amount of light.

Still another object of the present invention is to provide a laser driving device allowing output of an appropriate amount of light, regardless of a change in the ambient temperature.

Still another object of the present invention is to provide a laser driving device capable of stabilizing the amount of emitted light with a simple structure.

Still another object of the present invention is to provide a laser driving device allowing extremely easy inspection and repair.

The foregoing and still other objects of the present invention will become fully apparent from the following description.

DETAILED DESCRIPTION OF THE PREFERRED EMBODIMENTS

Figure 1:
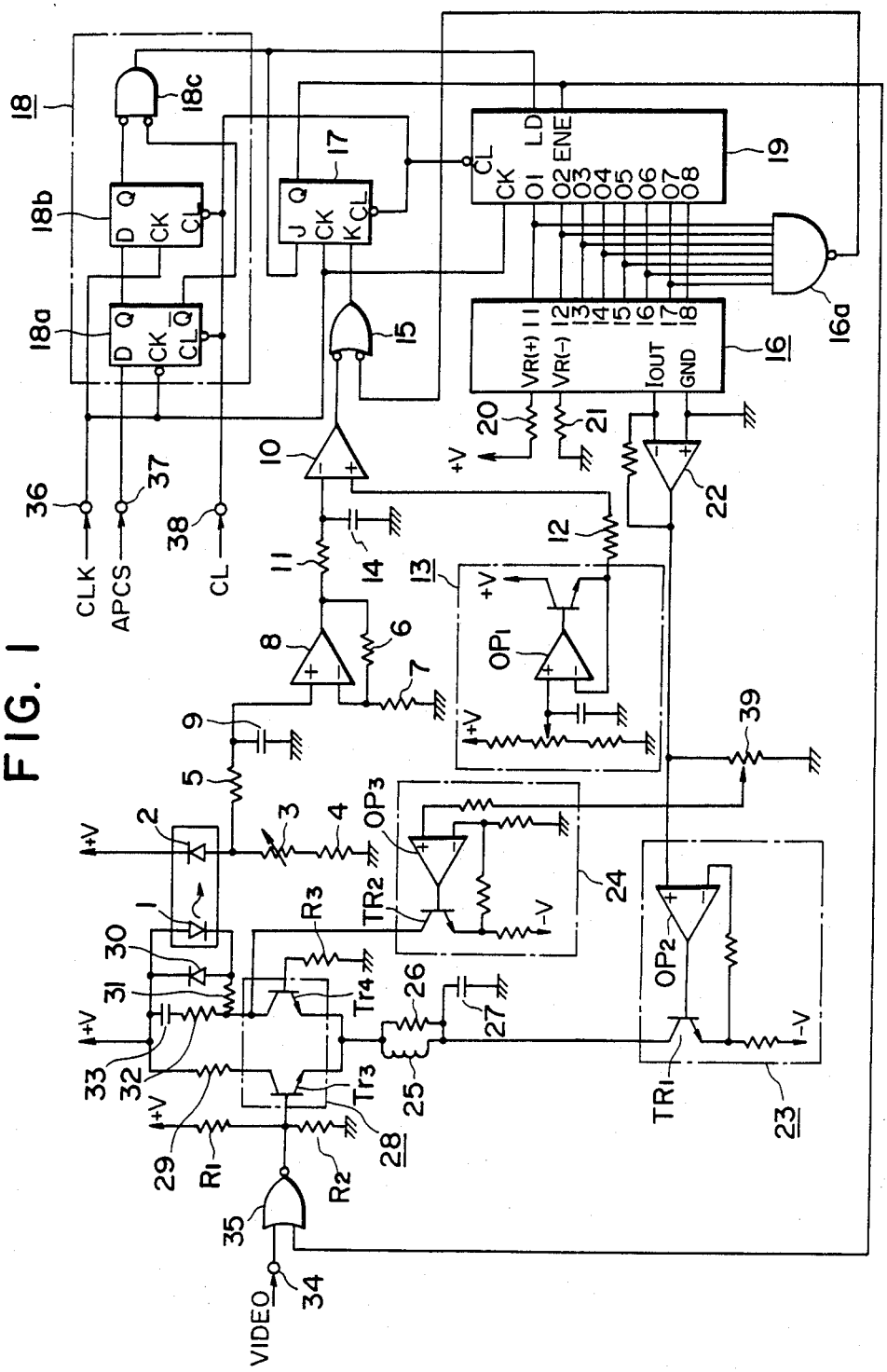
FIG. 1 is a circuit diagram of a laser unit constituting an embodiment of the present invention.

FIG. 1 is a circuit diagram of a laser unit embodying the present invention, wherein provided are a laser 1; a photodetector 2 provided on a same substrate as that of the laser 1; a variable resistor 3 for regulating the sensitivity of the photodetector 2; a load resistor 4 for the photodetector 2; resistors 5–7 for determining the gain of an operational amplifier 8; a capacitor 9 for avoiding an overshoot voltage, in case of a stepwise increase of the amount of light emitted by the laser 1, thus preventing the erroneous functioning of a comparator 10, of which an inverted input terminal is connected to a current-limiting resistor 11, while a non-inverted input terminal is connected to a current-limiting resistor 12; a voltage source 13 utilizing an operational amplifier OP1 and supplying a reference voltage to the comparator 10 through the resistor 12; a capacitor 14 for avoiding an overshoot voltage, in case of a stepwise increase of the amount of light emitted by the laser 1, thus preventing the erroneous functioning of the comparator 10; an invert-NOR gate 15 receiving the output of the comparator 10 and the output of a D/A converter 16 supplied through a decoder 16a composed of a NAND gate and supplying an output signal to the terminal K of a JK flip-flop 17; a pulse synchronizer 18 of a known structure composed of a D flip-flops 18a, 18b and an invert-NAND gate; a counter 19 enabled in response to the output of the JK flip-flop 17 and stepwise increasing the amount of light in response to a clock signal CLK to be explained later; resistors 20, 21 for determining the reference voltage of the D/A converter; a current-voltage converting circuit 22 for converting the output current of the D/A converter 16 into a voltage of a determined level; a constant current circuit 23 composed of a transistor Tr1 and an operational amplifier OP2 and releasing an output current used for switching the laser 1; a constant current circuit 24 composed of a transistor Tr2 and an operational amplifier OP3 and releasing an output current used as the bias current for the laser 1; a coil 25 connected to a resistor 26 for reducing the Q factor; a capacitor 27 for avoiding an overshoot in the current of the laser 1; a differential current switch composed of emitter-connected transistors Tr3, Tr4 and resistors R1–R3; a resistor 29 for regulating the current balance of the differential current switch 28; a diode 30 for preventing the application of an inverse voltage to the laser 1; a resistor 31 for preventing a ringing phenomenon in the laser current, caused by a sudden change in the laser current in the vicinity of the forward bias voltage $V_0$ of the laser 1; a damper resistor 32 for preventing an overshoot in the laser current; a capacitor 33 for intercepting a DC component in the damper resistor 32, wherein the damper resistor 32 and the capacitor 33 are so selected as to have a time constant in a range of several hundred to several thousand nanoseconds; an input terminal 34 for receiving image signals VIDEO supplied from an unrepresented external apparatus; a NOR gate 35 for receiving said image signals VIDEO and the output of the JK flip-flop 17; an input port 36 for receiving the clock signals CLK; an input port 37 for receiving a pulse signal APCS for automatic light control; an input port 38 for receiving a clear signal CL; and a variable resistor 39 for regulating the bias current, thereby controlling the ratio of the bias current to the switching current of the laser 1.

The D flip-flops 18a, 18b have input terminals D and output terminals Q. The JK flip-flop 17 has input terminals J, K and an input terminal CK for the clock signals CLK. The counter 19 has a load terminal LD, an enable input terminal ENB, and output terminals 01–08 in which 01 and 08 respectively indicate the least significant bit (LSB) and the most significant bit (MSB). The D/A converter 16 has digital input terminals I1–I8, reference current terminals $V_{R(+)}$, $V_{R(-)}$, and a current output terminal $I_{out}$.

In the following there will be given an explanation of the function of the circuit shown in FIG. 1, while making reference to FIGS. 2(a) to 2(j).

Figure 2:
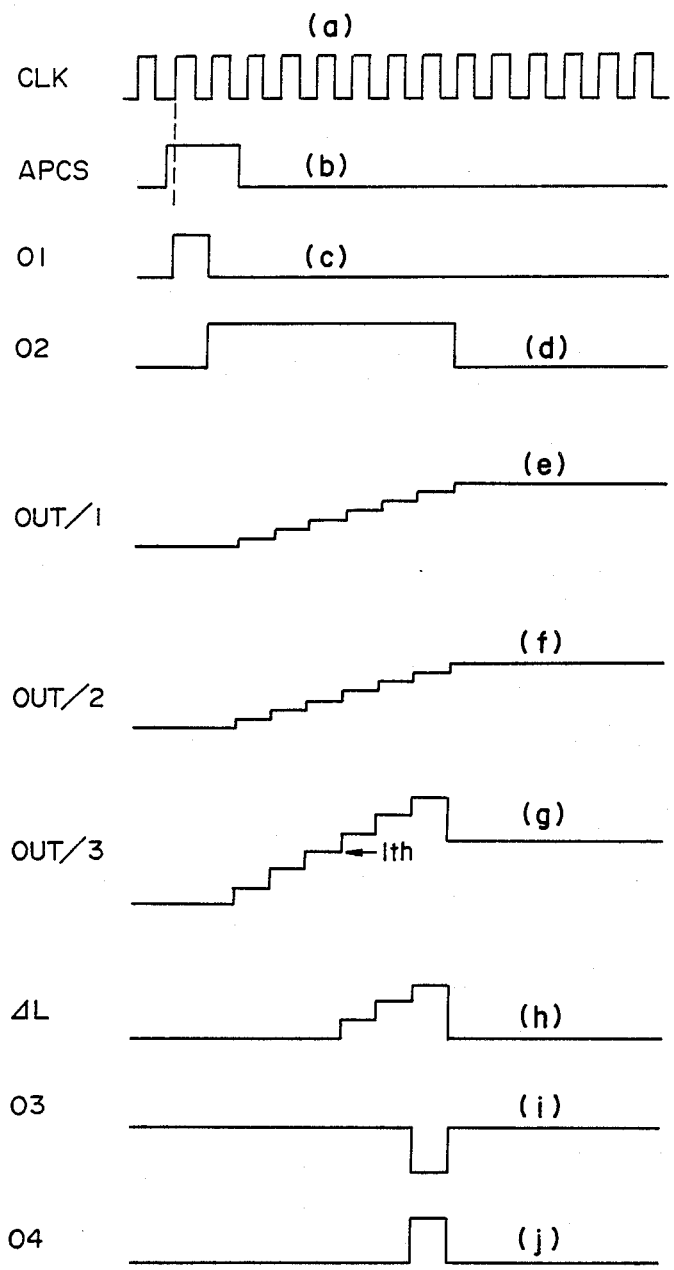
FIG. 2 is a timing chart showing the function of the circuit shown in FIG. 1.

FIGS. 2(a) to 2(j) are timing charts for explaining the function of the circuit shown in FIG. 1. FIG. 2(a) shows the clock signals CLK; (b) shows the light controlling pulse signal APCS: (c) shows the output signal 01 from the pulse synchronizer 18; (d) shows the output signal 02 of the JK flip-flop 17; (e) shows the output current out/1 of the constant current circuit 23; (f) shows the output current out/2 of the constant current circuit 24; (g) shows the laser current out/3; (h) shows the change $\Delta L$ in the amount of light; (i) shows the output signal 03 of the comparator 10; and (j) shows the output signal 04 of the invert-NOR gate 15.

At the start of power supply, a clear signal CL is supplied from an unrepresented resetting circuit to the input port 38 for resetting the pulse synchronizer 18, the JK flip-flop 17 and the counter 19. The clock signals CLK shown in FIG. 2(a) are constantly supplied to the input port 36.

When a laser beam emitted by the laser 1 irradiates a non-image area of the printer, an unrepresented printer control circuit supplies the input port 37 with a pulse signal APCS, shown in FIG. 2(b), and the pulse synchronizer fetches the pulse signal APCS corresponding to a clock pulse to supply the output signal 01, shown in FIG. 2(c), to the input terminal J of the JK flip-flop 17 and to the load terminal LD of the counter 19. Consequently the JK flip-flop 17 is set, and the output signal 02, shown in FIG. 2(d), is supplied from the output terminal Q to the enable terminal ENE of the counter 19 and to the NOR gate 35. The output signal 03 indicates that the laser current out/3 is increasing. On the other hand, the counter 19, which is reset to zero by the output signal 01 of the pulse synchronizer 18, is enabled by the output signal 02 from the output terminal Q of the JK flip-flop 17 and supplies digital signals from the output terminals 01–08 to the input terminals I1–I8 of the D/A converter 16 in response to each clock signal.

Figure 4:
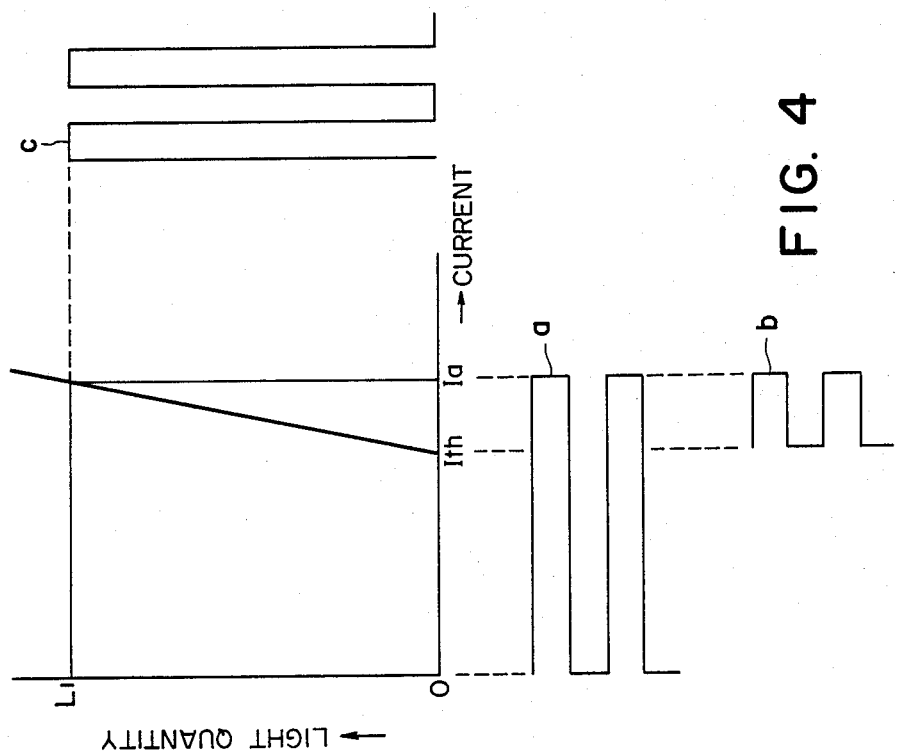
FIG. 4 is a chart showing the light emission characteristic of a laser.

In response the D/A converter 16 increases the output $I_{out}$ the output of
out to increase the current-voltage converting circuit 22, whereby the outputs of the constant current circuits 23, 24 are increased at each clock signal. In response to the output signal 02 from the output terminal Q of the JK flip-flop 17, the NOR gate 35 releases an L-level output to turn on the transistor Tr4 of the differential current switch 28, whereby the laser 1 is supplied with a current. The laser current out/3 is equal to the sum of the output currents out/1, out/2 of the constant current circuits 23, 24. The laser 1 emits light when the laser current out/3 exceeds the threshold value $I_{th}$ by successive increases. The change $\Delta L$ in the amount of emitted light is detected by the photodetector 2 and amplified by the operational amplifier 8. The comparator 10 compares the output voltage corresponding to the amount of light with the output voltage of the constant voltage source 13. When the inverted input level of the comparator 10 exceeds the non-inverted input level thereof, the comparator 10 inverts the output signal 03 as shown in FIG. 2(i), whereby the output signal 04 is supplied to the input terminal K of the JK flip-flop 17. In response the output signal 02 from the output terminal Q of said flip-flop 17 is shifted to the L-level, whereby the NOR gate 35 releases an H-level output signal. Thus the transistor Tr4 of the differential current switch 28 is turned off, and the current from the constant current circuit 23 is no longer supplied to the laser 1. In this state, if the image signals VIDEO are supplied through the input terminal 34 to the NOR gate 35, the differential current switch 28 is turned on and off according to said image signals VIDEO, whereby the switching waveform of the constant current circuit 23 overlaps with the laser current out/3 to provide a current b shown in FIG. 4. Also in response to the L-level output signal 02 of the JK flip-flop 17, the enable terminal ENE of the counter 19 receives an L-level signal, whereby the count value at this point is retained and the image recording is conducted with an amount of light corresponding to thus retained count. The retained value is reset by the clear signal CL emitted before the start of recording a next page.

In case the laser output is interrupted the during the course of an increase in of the amount of light, for example due to an incomplete contact of the photodetector 2 or the deterioration of the laser, the laser current out/3 continues to increase even after the amount of laser light reaches the determined amount. For this reason the decoder 16a inspects the output of the counter 19 in order to prohibit the laser current out/3 from exceeding a determined level, and, in response to such an excessive laser current out/3, an output pulse is supplied to the input terminal K of the JK flip-flop 17 functioning as current control means, whereby the output signal 02 from the output terminal Q is shifted to the L-level, thereby holding the laser current out/3 in this state. The image recording is thereafter conducted with an amount of light corresponding to thus held laser current. The current limiting simultaneously limits the switching current and the bias current of the laser 1. Also the output of the decoder 16a may be utilized for lighting for example a lamp for warning.

The variable resistor 39 regulates the ratio of the bias current to the switching current, in order to compensate for the eventual fluctuation in the threshold current of the laser 1. The variable resistor 39 and the sensitivity compensating variable resistor 3 may be provided on the same substrate as that provides for the laser 1 and the photodetector 2 for facilitating maintenance. The variable resistor 3 alone may be provided on the substrate, since the fluctuation in the threshold current is smaller than that in the sensitivity of the photodetector 2.

Figure 3:
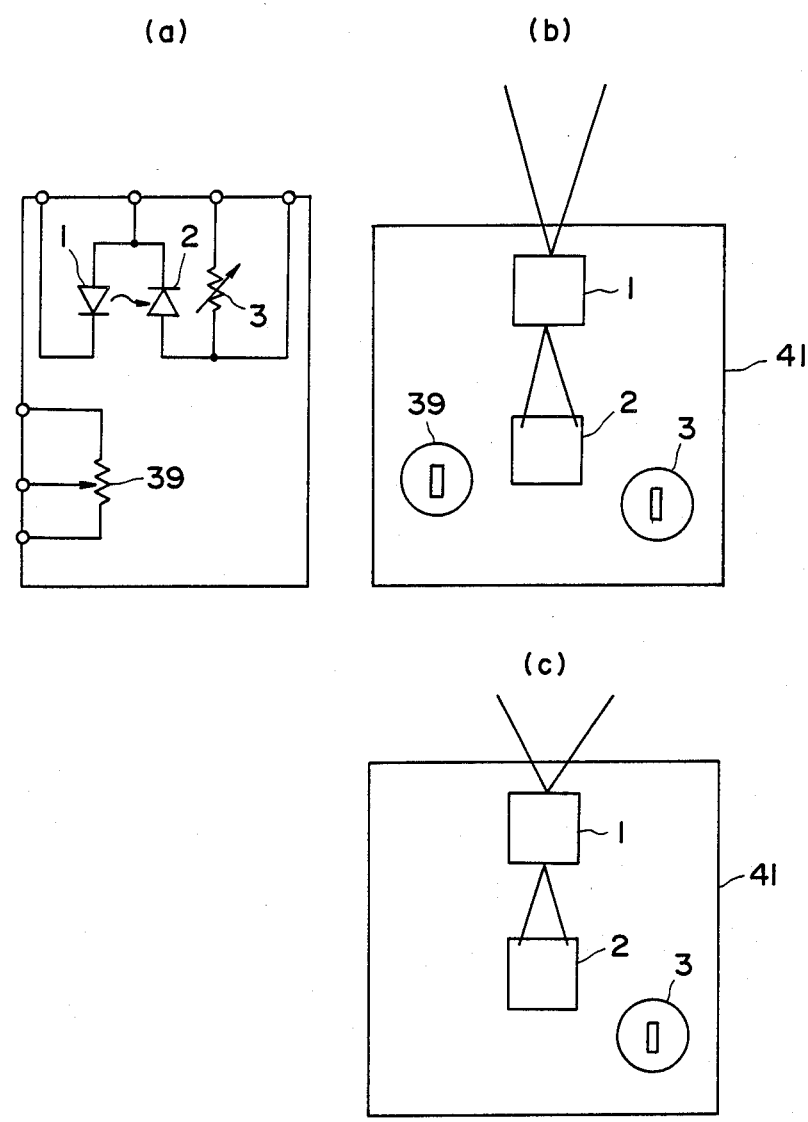
FIGS. 3(a) to 3(c) are schematic views showing the arrangement of a laser unit constituting an embodiment of the present invention.
Figure 5:
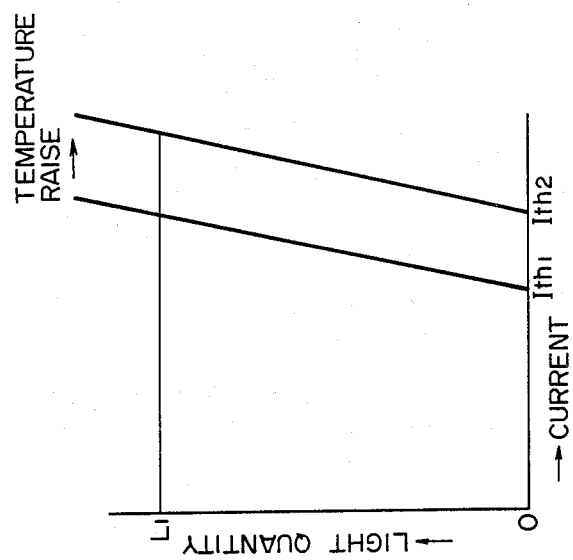
FIG. 5 is a chart showing the threshold value characteristic of a laser.

FIGS. 3(a) to 3(c) illustrate the arrangement of a laser unit embodying the present invention, wherein FIG. 3(a) shows the arrangement of the laser 1, photodetector 2 and variable resistors 3, 39 mounted on a same substrate 41, while FIG. 3(b) is a circuit diagram of the laser unit shown in FIG. 3(a), and FIG. 3(c) is the arrangement of the laser 1, photodetector 2 and variable resistor 3 mounted on a same substrate 41.

In the foregoing embodiment the outputs of the constant current circuits 23, 24 increase stepwise, but they may be increased linearly.

Also in the foregoing embodiment the switching current and the bias current are controlled by the digital output of the counter 19, but a similar control may be achieved according to the analog output after D/A conversion.

What is claimed is:

1. A laser driving device comprising:
a laser element capable of emitting a laser beam when supplied with a current equal to or exceeding a threshold value;
supply means for supplying a driving current to said laser element, said driving current comprising a switching current component which is turned on and off in accordance with an input signal and a bias current component;
detecting means to detect the quantity of light from said laser element; and
control means for controlling said supply means in accordance with an output from said detecting means, wherein said control means is operable to vary both the switching current and the bias current so as to vary said currents to maintain a constant ratio thereof.

2. A laser driving device according to claim 1, wherein said bias current does not exceed said threshold value.

3. A laser driving device according to claim 1, wherein said supply means comprises first current generating means for generating the switching current, and second current generating means for generating the bias current, and wherein said control means comprises detection means for detecting the amount of light emitted by said laser element, and current control means for simultaneously controlling said first and second current generating means in response to the output of said detection means.

4. A laser driving device according to claim 3, wherein said current control means is adapted to control said first and second current generating means in such a manner as to increase the outputs thereof and to hold the amount of light emitted by said laser element when said amount of light reaches a predetermined value.

5. A laser driving device according to claim 4, wherein said current control means is adapted to stepwise increase said switching current and said bias current in synchronization with determined pulse signals.

6. A laser driving device according to claim 1, wherein said laser element is a semiconductor laser.

7. A laser driving device comprising:
a laser element capable of emitting a laser beam when supplied with a current equal to or exceeding a predetermined threshold value;
supply means for supplying a driving current to said laser element, said driving current comprising a switching current component which is turned on and off in accordance with an input signal and a bias current component;
detecting means to detect the quantity of light from said laser element;
control means for controlling said supply means in accordance with an output from said detecting means, wherein said control means is operable to vary both the switching current and the bias current so as to vary said currents to maintain a constant ratio thereof; and
limit means for limiting the switching current component and the bias current component in accordance with the control signal from said control means to said supply means so as not to flow through said laser element, when the driving current exceeds a predetermined level greater than a current level corresponding to a reference light quantity.

8. A laser driving device according to claim 7, wherein said bias current does not exceed said predetermined threshold value.

9. A laser driving device according to claim 7, wherein said control means is adapted to stepwise increase said switching current and said bias current in synchronization with predetermined pulse signals.

10. A laser driving device according to claim 9, wherein said control means comprises counter means for counting said pulse signals and outputting digital signals corresponding to the count value as said control signal.

11. A laser driving device according to claim 10, wherein said control means comprises decoder means for decoding the digital signals outputted from said counter means, and is adapted to hold said switching current and said bias current in such a manner as to avoid the supply of a larger current to the laser element when the output of said decoder means reaches a predetermined value.

12. A laser driving device comprising:
a laser element capable of emitting a laser beam when supplied with a current equal to or exceeding a predetermined threshold value;
first current supply means for supplying said laser element with a switching current component which is turned on and off in accordance with an input signal;
second current supply means for supplying said laser element with a bias current;
detection means for detecting the amount of light emitted by said laser element and outputting a signal corresponding to the amount of light detected;
comparing means for comparing said output signal of said detection means with a reference value and for outputting a common control signal in accordance with said comparison;
setting means optionally setting the ratio between the switching current and bias current; and
control means for varying both said switching current and said bias current in accordance with said common control signal so that the amount of light emitted from said laser element becomes a reference light quantity wherein said control means controlling the switching current on the basis of said common control signal and controlling said bias current on the basis of a signal obtained by dividing said common control signal in accordance with the ratio set by said setting means.

13. A laser driving device according to claim 12, wherein said bias current does not exceed said predetermined threshold value.

14. A laser driving device according to claim 1 further comprising means for adjusting said ratio.

* * * * *